(12) United States Patent
Miyano et al.

(10) Patent No.: US 7,050,271 B2
(45) Date of Patent: May 23, 2006

(54) ACTUATOR HAVING DOPED SILICON ARMS AND METHOD OF MAKING THE SAME

(75) Inventors: Masaichi Miyano, Akita (JP); Mitsunao Homma, Akita (JP)

(73) Assignee: TDK Corporation, Tokyo (JP)

( * ) Notice: Subject to any disclaimer, the term of this patent is extended or adjusted under 35 U.S.C. 154(b) by 217 days.

(21) Appl. No.: 10/720,142

(22) Filed: Nov. 25, 2003

(65) Prior Publication Data

US 2004/0145834 A1 Jul. 29, 2004

(30) Foreign Application Priority Data

Nov. 28, 2002 (JP) .......................... P2002-345815
Nov. 28, 2002 (JP) .......................... P2002-346476

(51) Int. Cl.
*G11B 5/48* (2006.01)
(52) U.S. Cl. ............................. 360/294.4; 360/265.9; 360/264.2
(58) Field of Classification Search .............. 360/294.4
See application file for complete search history.

(56) References Cited

U.S. PATENT DOCUMENTS 6,163,434 A * 12/2000 Zhang .................... 360/294.5
6,555,201 B1 * 4/2003 Dhuler et al. ............... 428/137
6,937,131 B1 * 8/2005 Rodgers et al. ............. 337/144
2001/0017750 A1 * 8/2001 Bonin ..................... 360/294.6

FOREIGN PATENT DOCUMENTS

| EP | 1 225 644 A2 | 7/2002 |
| EP | 1 306 908 A1 | 5/2003 |
| EP | 1 357 611 A1 | 10/2003 |
| JP | A 2001-320103 | 11/2001 |
| JP | A 2002-26411 | 1/2002 |
| JP | A 2002-289936 | 10/2002 |
| JP | A 2003-8093 | 1/2003 |
| WO | WO 01/97296 A1 | 12/2001 |

* cited by examiner

*Primary Examiner*—Jefferson Evans
(74) *Attorney, Agent, or Firm*—Oliff & Berridge, PLC (57) ABSTRACT

An actuator to which leads are easily attachable, and a method of making the same are provided. In the actuator in accordance with the present invention, a pair of silicon arms have their resistances lowered by being doped with impurities and are connected to each other by way of a glass substrate. A predetermined surface of each silicon arm is formed with a piezoelectric part, whereas a predetermined surface of the piezoelectric part is formed with a thin-film electrode. Therefore, the piezoelectric part is driven when a voltage is applied between a bonding wire attached to the thin-film electrode and a bonding wire attached to the silicon arm. Since the bonding wire can be attached to the silicon arm at any position thereon, wire bonding can be carried out while appropriately selecting positions and surfaces where the bonding wire is easily attachable.

11 Claims, 7 Drawing Sheets

ACTUATOR HAVING DOPED SILICON ARMS AND METHOD OF MAKING THE SAME

TECHNICAL FIELD

The present invention relates to an actuator utilizing a piezoelectric device, and a method of making the same. In particular, the present invention relates to an actuator employed for controlling the position of a magnetic head in a magnetic recording apparatus, and a method of making the same.

BACKGROUND ART

In recent years, magnetic recording density has been improving at a very rapid rate. When the track pitch width is narrowed so as to increase the recording density, for example, it becomes necessary to control the magnetic head position with respect to track positions with high precision. However, there is a limit to the magnetic head position regulation when depending on the control of a VCM (voice coil motor) alone. Hence, a two-stage servo control system carrying out high-precision head position control by an actuator in addition to the head position control by a VCM has been proposed.

Such an actuator is disclosed, for example, in the Japanese Patent Application Laid-open No. 2002-26411 and No. 2002-289936. In the actuator shown in these documents, a flat laminated piezoelectric device having an inner electrode is attached to each of a pair of flat arms opposing each other. A pair of electrodes for applying a voltage to the piezoelectric device are provided on the surface opposite from the surface facing the arm in the piezoelectric device, whereas respective leads are attached to the pair of electrodes.

However, the following problem exists in the above-mentioned conventional actuator. Namely, a high degree of positional accuracy is necessary for attaching two leads to a narrow end face of a piezoelectric device, whereby the leads are hard to attach to the device. When the piezoelectric device is made smaller so to be employed in a small-size actuator in particular, a higher degree of positional accuracy is required, which makes it harder to attach the leads.

For overcoming the above-mentioned problem, it is an object of the present invention to provide an actuator to which leads are easy to attach, and a method of making the same.

DISCLOSURE OF THE INVENTION

The actuator in accordance with the present invention comprises an insulating substrate; a pair of silicon arms, doped with an impurity, having respective one end parts connected to both end faces of the insulating substrate; a piezoelectric part formed on a surface opposite from the surface connected to the insulating substrate in each silicon arm; and a first electrode formed on a surface opposite from the surface opposing the silicon arm in each piezoelectric part.

In this actuator, a pair of silicon arms having lowered their resistance by doping with an impurity are connected to each other by way of an insulating substrate. Each silicon arm has a predetermined surface formed with a piezoelectric part, whereas the piezoelectric part has a predetermined surface formed with a first electrode. Therefore, when one of a pair of leads is attached to the first electrode while the other is attached to the silicon arm, and a voltage is applied between the pair of leads, the piezoelectric part is driven. Here, the lead can be attached to the silicon arm at any position thereon. Hence, the lead can be attached to appropriately selected positions and surfaces where the lead is easily attachable. As a consequence, leads can be attached to this actuator more easily than to the conventional actuator.

Preferably, the actuator further comprises a second electrode formed on the surface formed with the piezoelectric part in the silicon arm. Since the first and second electrodes are oriented in the same direction, it becomes easier to attach leads to the respective electrodes in this case.

Preferably, the insulating substrate is constituted by glass. In this case, anode bonding which allows bonding at a relatively low temperature can be used for connecting the insulating substrate to the silicon arms, and the insulating substrate can easily be shaped by etching.

The piezoelectric part may be a single-layer piezoelectric film, or have a laminate structure in which piezoelectric and electrode films are alternately laminated. Preferably, the piezoelectric film is constituted by PZT.

Preferably, the first electrode has a multilayer structure, in which the topmost layer is constituted by Au or Pt. This can significantly restrain the piezoelectric part from being eroded by an etchant utilized for making the actuator.

The method of making an actuator in accordance with the present invention comprises the steps of forming a piezoelectric film pattern on one surface each of two silicon substrates doped with an impurity; forming an electrode film on the piezoelectric film pattern; bonding the two silicon substrates, each formed with the piezoelectric film pattern and electrode film, to both sides of an insulating substrate, respectively, such that the piezoelectric film patterns are oriented outward; cutting a block having a predetermined form from a laminated substrate constituted by the two silicon substrates and insulating substrate laminated together; and forming a silicon arm by cutting the block after partly removing the insulating substrate in the block on one side.

In this method of making an actuator, two silicon substrates having lowered their resistance by doping with an impurity are connected to each other by way of an insulating substrate. Each silicon substrate is formed with a piezoelectric film pattern, whereas an electrode film is formed on the piezoelectric film pattern. Therefore, when one of a pair of leads is attached to an electrode corresponding to the electrode film while the other is attached to a silicon arm in the actuator made by using this method, and a voltage is applied between the pair of leads, a piezoelectric part is driven. Here, the lead can be attached to the silicon arm at any position thereon. Hence, the lead can be attached to appropriately selected positions and surfaces where the lead is easily attachable. As a consequence, leads can be attached to this actuator more easily than to the conventional actuator.

Preferably, the method further comprises the step of forming an electrode pattern on the silicon substrate. In this case, the electrode formed on the piezoelectric film and the electrode of the electrode pattern are oriented in the same direction, which makes it easier to attach leads to the respective electrodes.

Preferably, the insulating substrate is constituted by glass. In this case, anode bonding which allows bonding at a relatively low temperature can be used for connecting the insulating substrate to the silicon substrates, and the insulating substrate can easily be shaped by etching.

Preferably, the piezoelectric film pattern is constituted by PZT.

BEST MODES FOR CARRYING OUT THE INVENTION

In the following, modes which are considered the best when embodying the actuator and the method of making the same in accordance with the present invention will be explained in detail with reference to the accompanying drawings. Constituents identical or equivalent to each other will be referred to with numerals identical to each other without repeating their overlapping explanations.

First Embodiment

Figure 1:
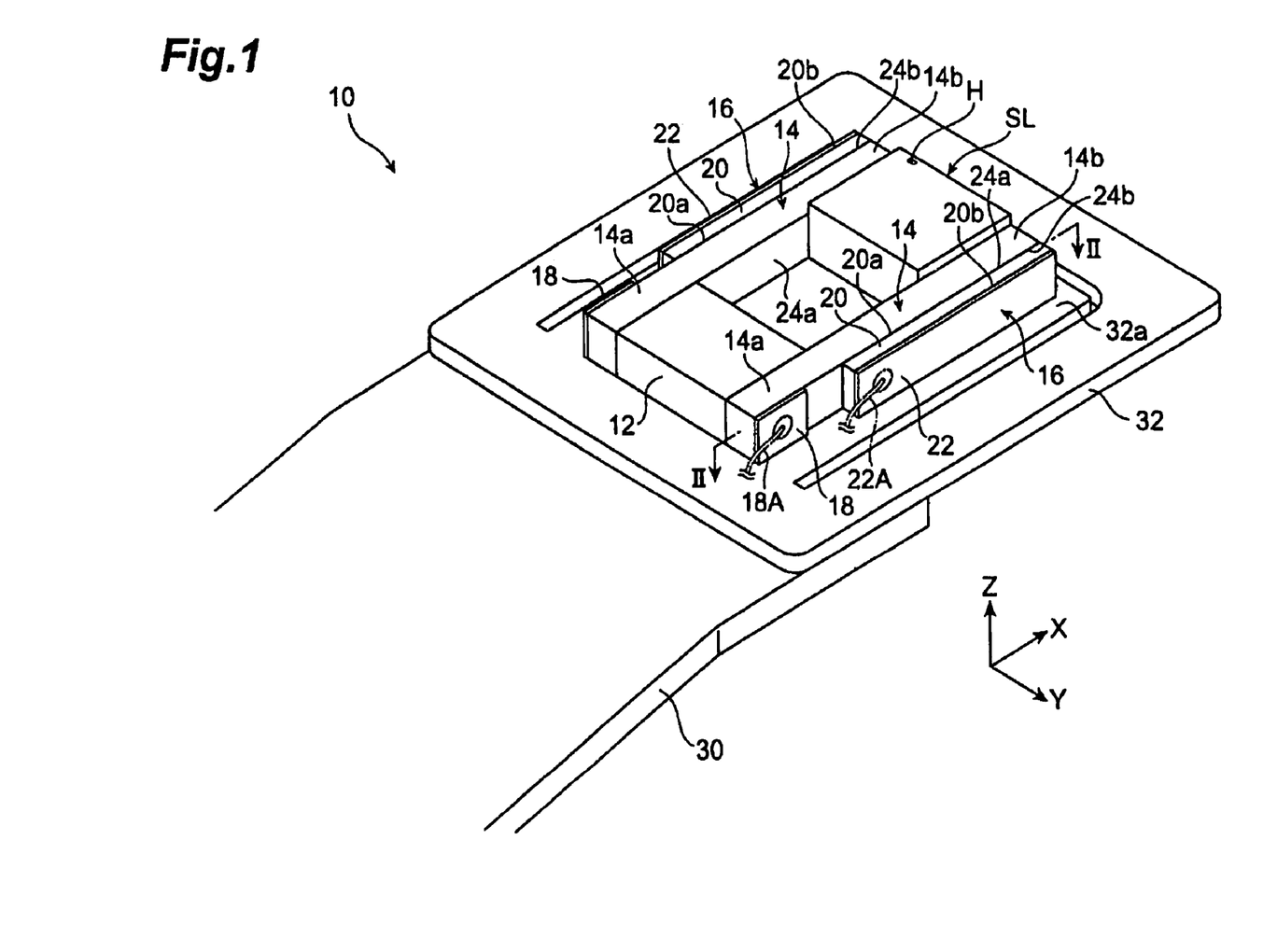
FIG. 1 is a schematic perspective view showing the actuator in accordance with a first embodiment of the present invention.

FIG. 1 is a schematic perspective view showing the actuator in accordance with a first embodiment of the present invention. As shown in FIG. 1, the actuator 10 in accordance with the first embodiment of the present invention is an actuator for HDD servo control, and displaces a head slider (hereinafter referred to as "slider") SL. The slider SL comprises a thin-film magnetic head H, which reads magnetic recording information from hard disks and records magnetic recording information onto hard disks. The slider SL has a substantially rectangular parallelepiped form, whose upper face in FIG. 1 is an air bearing surface facing a hard disk. The slider SL in FIG. 1 is illustrated schematically, while omitting a slider rail for adjusting the amount of levitation from the hard disk, etc.

The actuator 10 comprises a glass substrate (insulating substrate) 12 formed like a rectangular plate; a pair of silicon arms 14, 14, each formed like a rectangular column; and respective arm drivers 16 and thin-film electrodes (second electrodes or electrodes for outer connections) 18 attached to the silicon arms 14, 14. The actuator 10 is mounted to a suspension arm 30 of a hard disk drive. The suspension arm 30 has a leading end provided with a gimbal 32, and is driven by a voice coil motor. More specifically, the actuator 10 is bonded and secured to a tongue 32a of the gimbal 32. Since the silicon arms 14, 14 are required to swing, an adhesive for securing the actuator 10 to the gimbal 32 is applied to only the glass substrate 12.

Each silicon arm 14 is constituted by single-crystal silicon doped with impurities for lowering its resistance, and exhibits a resistivity of 1 Ωcm or less. Single-crystal silicon employed as a material for the silicon arm 14 is excellent as an elastic material, since it does not plastically deform within the temperature range in which the hard disk drive is used. Also, it has a high mechanical strength with less crystal defects, thereby enabling high-precision position control. For the impurities, any of donors such as phosphorus and acceptors such as aluminum and boron can be employed.

The two silicon arms 14, 14 extend in parallel with each other, while having respective end faces 14a anodically bonded to opposing end faces of the glass substrate 12. Namely, a substantially U-shaped integral structure in which the glass substrate 12 supports a pair of silicon arms 14, 14 is formed. In the following, for convenience of explanation, directions in which the silicon arms 14, 14 extend and align will be referred to as X and Y directions, respectively, whereas a direction orthogonal to the X and Y directions will be referred to as Z direction.

Each arm driver 16 is formed on a surface 24b opposite from the surface 24a bonded to the glass substrate 12in the respective silicon arm 14. The arm driver 16 extends in one direction like a rectangular plate, and is attached to the silicon arm 14 such that its longitudinal direction extends along the longitudinal direction (depicted X direction) of the silicon arm 14. Each thin-film electrode 18 is also formed like a substantially rectangular plate on the surface 24b opposite from the surface 24a bonded to the glass substrate 12 in the respective arm 14. The slider SL is secured to the inner side face 24a (surface bonded to the glass substrate 12) of each silicon arm 14 with an adhesive.

Figure 2:
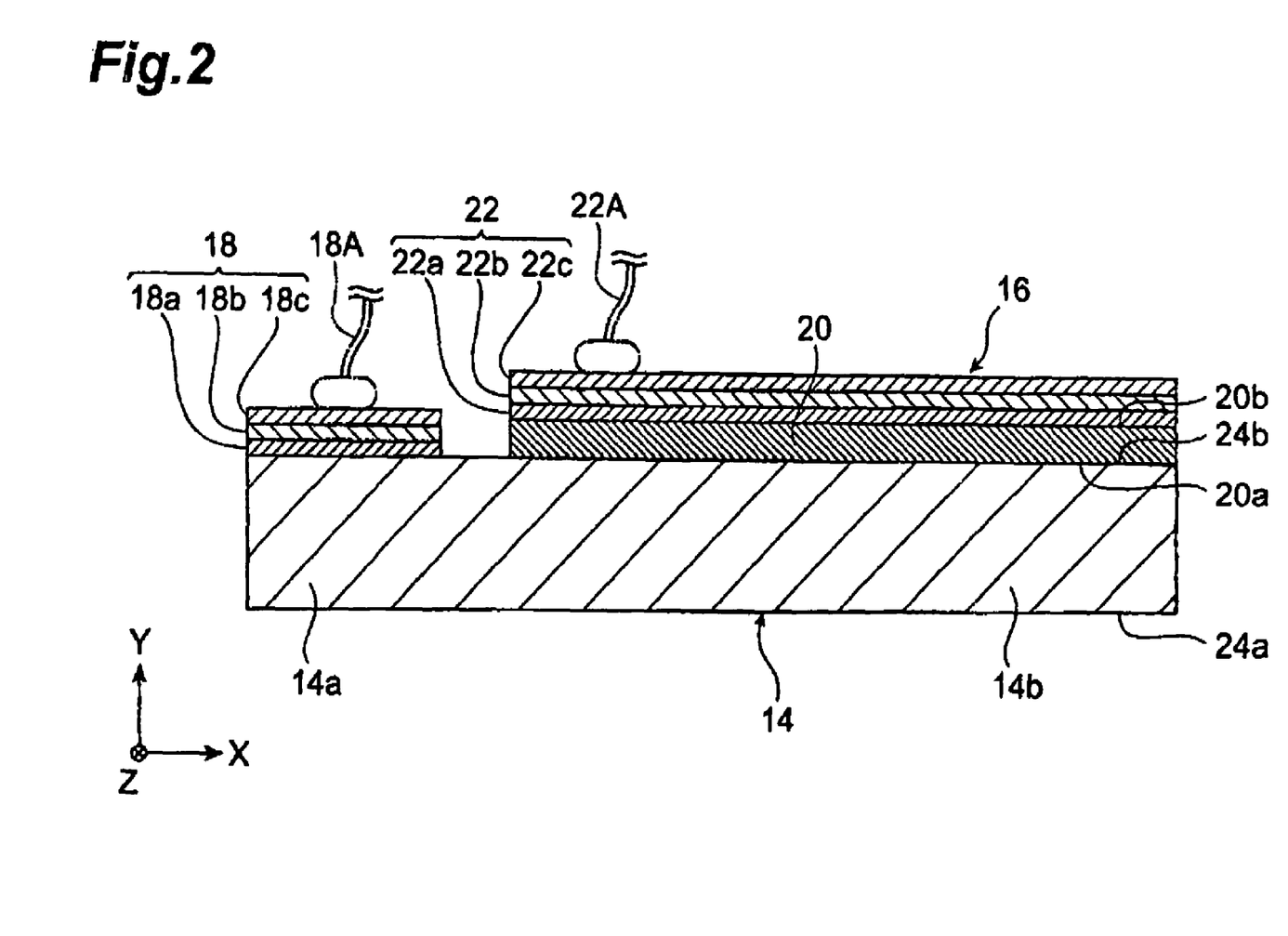
FIG. 2 is a sectional view of a silicon arm taken along the line II—II of FIG. 1.

With reference to FIG. 2, cross-sectional structures of the arm driver 16 and thin-film electrode 18 will now be explained. FIG. 2 is a sectional view of the silicon arm 14 taken along the line II—II of FIG. 1.

As shown in FIG. 2, the arm driver 16 is formed in a partial region of the surface 24b of the silicon arm 14, and is constituted by a piezoelectric part 20 and a thin-film electrode (first electrode) 22. The piezoelectric part 20 is a single-layer piezoelectric film constituted by PZT (a mixture of lead zirconate and lead titanate). The thin-film electrode 22 is laminated on a surface 20b opposite from the surface 20a bonded to (opposing) the silicon arm 14 in the piezoelectric part 20. The thin-film electrode 22 has a three-layer structure in which a Cr layer 22a, an Ni layer 22b, and an Au layer 22c are laminated in this order from the side closer to the piezoelectric part 20.

On the other hand, the thin-film electrode 18 is formed on the surface 24b on one end part 14a side of the silicon arm 14 so as not to overlap the region formed with the arm driver 16. As with the thin-film electrode 22, the thin-film electrode 18 has a three-layer structure (constituted by a Cr layer 18a, an Ni layer 18b, and an Au layer 18c successively from the side closer to the silicon arm 14).

When a pair of bonding wires (pair of leads) 18A, 22A for supplying power are connected to the thin-film electrode 18 on the silicon arm 14 and the thin-film electrode 22 on the piezoelectric part 20, respectively, in the actuator 10, a voltage is applied to the piezoelectric part 20 of the arm driver 16 in the thickness direction (Y direction in FIGS. 1 and 2) through the silicon arm 14 having lowered its resistance. When a voltage is applied to the piezoelectric part 20 as such, the piezoelectric part 20 of the arm driver 16 expands or contracts according to its polarizing direction, whereby the slider SL held by the piezoelectric part 20 on the side of the other end part 14b of the silicon arm 14 is displaced along the Y direction.

Namely, the actuator 10 can control the position of the slider SL, and finely fluctuate the slider SL at a level which cannot be realized by the cooperation of a voice coil motor and suspension arms. Since the arm driver 16 formed like a rectangular plate is attached to the silicon arm 14 so as to have a longitudinal direction extending along the longitudinal direction of the silicon arm 14, displacements of the arm driver 16 can effectively be transmitted to the silicon arm 14, whereby the silicon arm 14 can be controlled with high precision.

As explained in detail in the foregoing, each silicon arm 14 having lowered its resistance by doping with impurities is utilized as a conductive path for applying a voltage to the piezoelectric part 20. Since a pair of silicon arms 14, 14 are connected to each other by way of an insulating glass substrate, each silicon arm 14 can be energized regardless of whether the other silicon arm 14 is energized or not.

Formed on the upper face 20b of the piezoelectric part 20 is the thin-film electrode 22 to which one bonding wire 22A in the pair of bonding wires 18A, 22A for applying a voltage to the piezoelectric part 20 is attached. As a consequence, a voltage can be applied to the piezoelectric part 20 regardless of where the other bonding wire 18A in the pair of bonding wires 18A, 22A is attached to the silicon arm 14. Namely, positions and surfaces where the bonding wire 18A is easily attachable can be selected as appropriate, so as to attach the bonding wire 18A to the silicon arm 14. Therefore, the couple of bonding wires 18A, 22A can be attached more easily to this actuator than to the conventional actuator. Also, since the electrically conductive silicon arm 14 is utilized as a conductor in contact with one side of the piezoelectric part 20, a wiring structure for supplying power to the piezoelectric part 20 is simplified.

When attaching the bonding wire 18A to the silicon arm 14 by way of the thin-film electrode 18, the thin-film electrode 18 is formed on the surface 20a formed with the arm driver 16 as mentioned above. Since the thin-film electrodes 18 and 22 are oriented in the same direction (Y direction in FIGS. 1 and 2), the bonding wires 18A, 22A can easily be attached thereto along the Y direction.

With reference to FIGS. 3A to 3E, a procedure of making the actuator 10 will now be explained. FIGS. 3A to 3E are schematic views showing a procedure of making the actuator 10 in accordance with the first embodiment of the present invention.

Figure 3A:
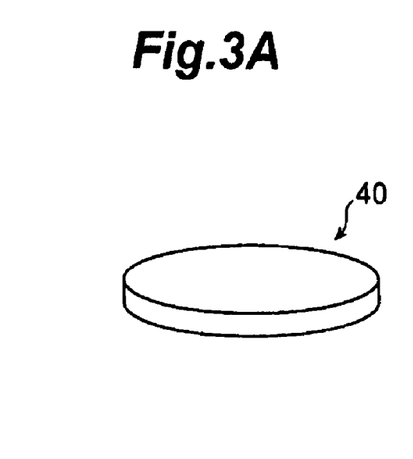
FIGS. 3A to 3E are schematic views showing a procedure of making the actuator in accordance with the first embodiment of the present invention.

First, for making the actuator 10, a disk-shaped glass substrate (insulating substrate) 40 to become a glass substrate 12 is prepared, and its front and rear faces are ground (see FIG. 3A). Subsequently, two single-crystal silicon substrates 42, each shaped like a disk having the same diameter as that of the glass substrate 40, are bonded to the ground front and rear faces, respectively, so as to form a laminated substrate 44 (see FIG. 3B). Each of these silicon substrates 42 has a resistivity of 1 Ωcm or less as a result of doping with impurities. The glass substrate 40 and the silicon substrates 42 are anodically bonded to each other. This can bond the glass substrate 40 and silicon substrates 42 to each other with favorable dimensional accuracy at a relatively low temperature. Also, the anode bonding is highly reliable and leaves nothing at the bonding interface. When an adhesive is used for bonding, by contrast, a residue occurs at the time of glass etching, which makes it necessary to add a process of removing the residue to the flow of making the actuator 10. The surface 42b opposite from the surface 42a bonded to the glass substrate 40 in the silicon substrate 42 has already been formed with a piezoelectric film pattern in which electrode films are laminated and an electrode pattern.

With reference to FIGS. 4A to 4H, a procedure of forming a piezoelectric film pattern and an electrode pattern on to a silicon substrate will now be explained. FIGS. 4A to 4H are schematic sectional views showing a procedure of forming the piezoelectric film pattern and electrode pattern onto the silicon substrate in a region corresponding to one actuator.

Figure 4A:
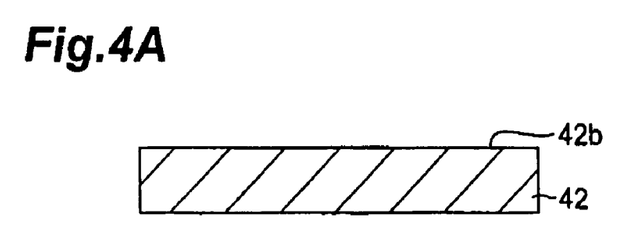
FIGS. 4A to 4H are schematic sectional views showing a procedure of forming a piezoelectric film pattern and an electrode pattern onto a silicon substrate in a region corresponding to one actuator.
Figure 4B:
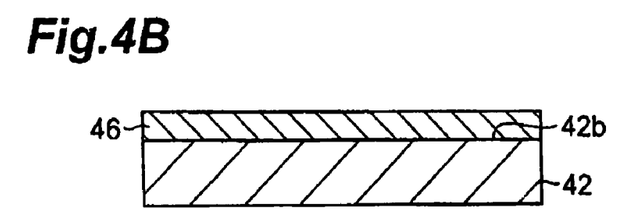
Figure 4C:
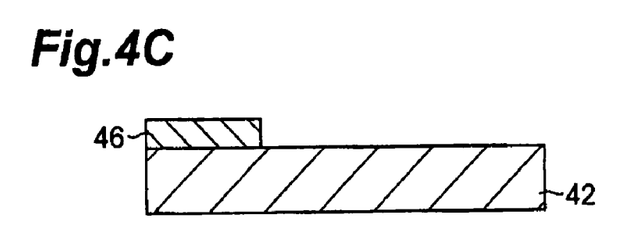
Figure 4D:
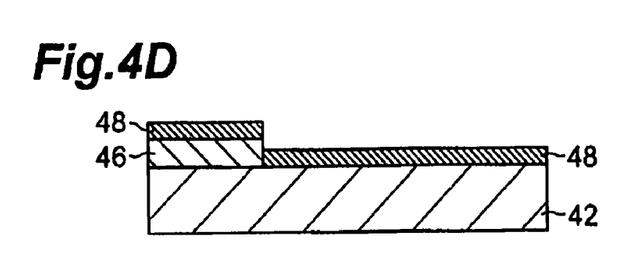
Figure 4E:
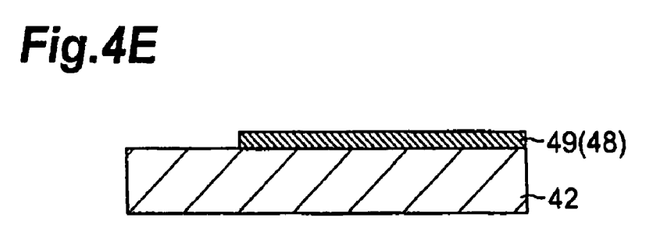

First, a silicon substrate 42 doped with impurities is prepared (see FIG. 4A), and one surface 42b thereof is formed with a mask layer 46 made of a film of $SiO_2$ or PSG (phosphorus-doped glass) to become a sacrificial layer (see FIG. 4B). Thereafter, as shown in FIG. 4C, the part of mask layer 46 corresponding to the region to be formed with the piezoelectric part 20 is etched away with HF or buffered HF. Then, as shown in FIG. 4D, a piezoelectric film 48 made of PZT is formed. For forming this film, sol-gel method, ion beam sputtering, RF magnetron sputtering, DC magnetron sputtering, MOCVD, PLD, hydrothermal synthesis, electrophoresis, and the like can be utilized. Though the piezoelectric film 48 is also formed on the mask layer 46, the latter is lifted off, whereby only the piezoelectric film (piezoelectric film pattern) 49 directly formed on the surface 42b of the silicon substrate 42 remains as shown in the FIG. 4E. For yielding the piezoelectric film 48 with favorable crystallinity, a <100>-oriented Pt film may be formed on the surface of the silicon substrate 42 as appropriate before forming the piezoelectric film 48 on the silicon substrate 42.

Figure 4F:
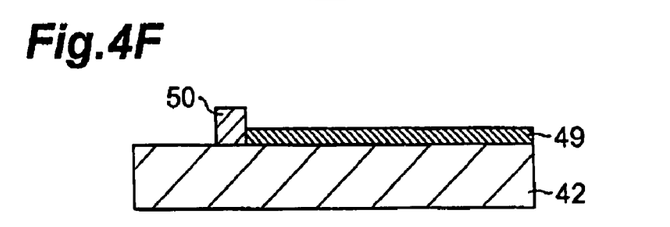
Figure 4G:
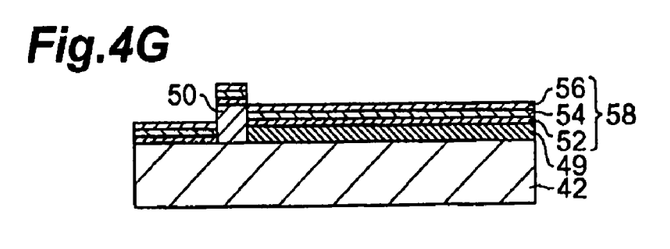
Figure 4H:
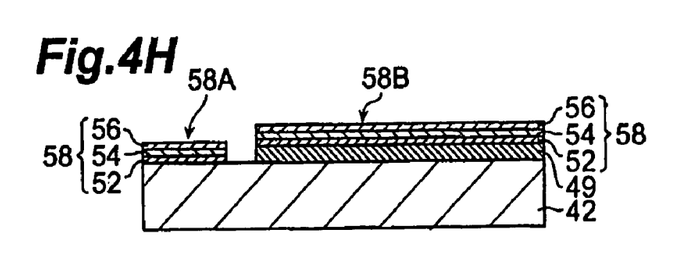

As shown in FIG. 4F, a liftoff resist layer 50 higher than the piezoelectric film 48 is formed (patterned) in an area between the respective regions to be formed with the thin-film electrodes 18 and 22. Thereafter, as shown in FIG. 4G, a Cr layer 52, an Ni layer 54, and an Au layer 56 are successively formed by a thin-film forming technique such as sputtering, thus yielding an electrode film 58 having a three-layer structure. Finally, the liftoff resist layer 50 is lifted off, thus forming an electrode film (electrode pattern) 58A to become the thin-film electrode 18 laminated on the silicon substrate 42 and an electrode film 58B to become the thin-film electrode 22 laminated on the piezoelectric film pattern 49 (see FIG. 4H).

Figure 3B:
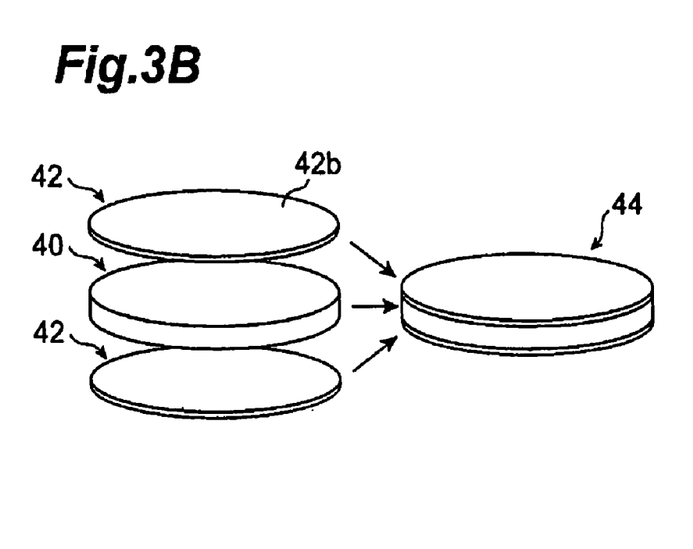

Each of the two silicon substrates 42 shown in FIG. 3B is formed with the piezoelectric film pattern 49 in which the electrode films 58B are laminated and the electrode pattern 58A in each area to become a silicon arm 14. Thus formed patterns are arranged like grids. The two silicon substrates 42 are bonded to both sides of the glass substrate 40, respectively, such that the surfaces 42b formed with the piezoelectric film pattern 49 and electrode pattern 58A are oriented outward, thus yielding a disk-shaped laminated substrate 44.

Figure 3C:
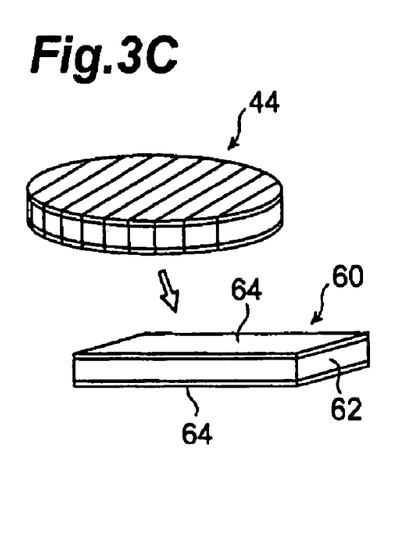
Figure 3D:
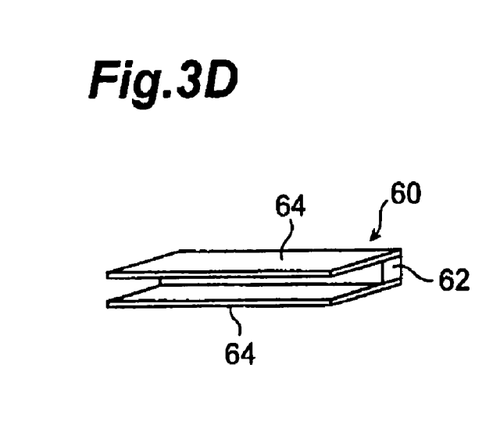

Then, as shown in FIG. 3C, a block 60 in which a number of silicon arms are arranged in parallel with each other is cut out from the laminated substrate 44. The block 60 comprises a glass block 62 and a pair of silicon blocks 64, 64 disposed on both sides of the glass block 62, respectively. Then, the glass block 62 in the block 60 is etched with HF or buffered HF while one glass block side face is masked, so as to leave longer silicon blocks 64 (series of silicon arms arranged in parallel) on both sides of the shortened glass block 62, respectively, as shown in FIG. 3D.

Figure 3E:
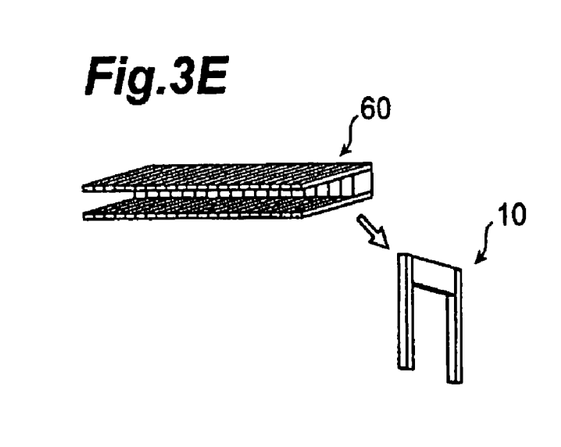

Thereafter, as shown in FIG. 3E, the etched block 60 is cut at equally spaced intervals in surfaces perpendicular to the longitudinal direction thereof, whereby the actuators 10 are obtained. The actuator 10 made by using a technique for bonding a plurality of substrates and a technique for forming thin films can easily be made smaller, and can respond to further reductions in the size of the slider SL.

Since the glass substrate 40 can easily be shaped by etching, the glass substrate 12 of the actuator 10 can easily be formed. Adjusting the etching time for the glass substrate 40 can easily regulate the length of silicon arms.

The Au layer formed as the topmost layer of the electrode film 58 acts as a resist layer when etching the glass substrate 40. This can significantly restrain the thin-film electrodes 18, 22 and the piezoelectric part 20 from being eroded by the etchant, without separately forming a resist for etching. Furthermore, even when the topmost layer of the electrode film 58 is the Pt layer, the effect is similar to when Au forms the topmost layer.

Since the laminated substrate in which the glass substrate 40 is held between the silicon substrates 42 is cut into a block 60 (silicon block 64/glass block 62/silicon block 64) in which a number of actuators 10 are arranged in parallel, and the glass block 62 corresponding to the glass substrate 12 is etched while in the block state, the glass substrate 12 is efficiently shaped, whereby the cost is cut down.

Dicers, slicers, wire saws, lasers, and the like can be used for cutting out and severing the block 60.

Each piezoelectric film 20 for driving the respective silicon arm 14 is a piezoelectric film and can directly be formed by using a conventional thin-film forming technique onto the silicon substrate 42 to become the silicon arm 14 as mentioned above, whereby operations of bonding the piezoelectric device and the like become unnecessary, and the mass-productivity of actuators improves. Such a piezoelectric film can be formed as a pattern by lifting off a sacrificial layer.

In the process of making the actuator 10, a block 60 having a sandwich structure of silicon block 64/glass block 62/silicon block 64 is obtained changing the thickness of the silicon block 64 (i.e., silicon substrate 42) alters the rigidity of the silicon arm 14, whereby actuators having desirable amounts of displacement can be made.

Second Embodiment

Though the above-mentioned first embodiment shows the arm driver 16 having a single-layer piezoelectric film in accordance with the present invention, the arm driver 16 may have a laminate structure in which piezoelectric films and inner electrode films are alternately laminated. Such an arm driver with a laminated structure maybe made by various procedures that utilize known thin film stacking techniques. With reference to FIGS. 5A to 5F, a procedure of making an arm driver having such a laminate structure will now be explained. FIGS. 5A to 5F are schematic sectional views showing a procedure for forming an arm driver in another embodiment.

Figures 5A, 5B:
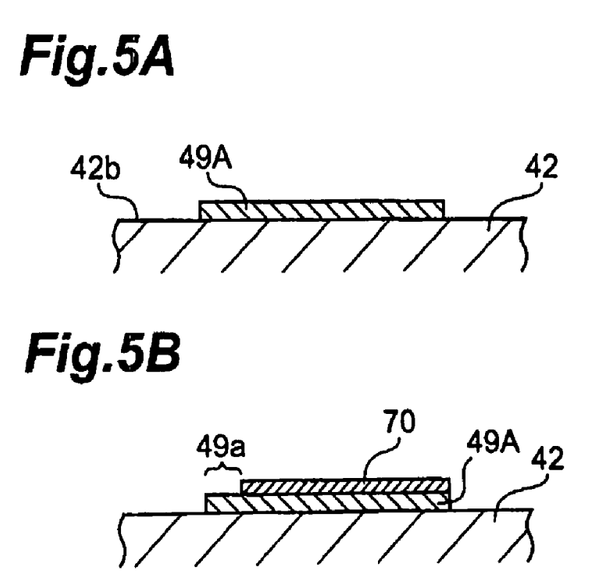
FIGS. 5A to 5F are schematic sectional views showing a procedure for forming an arm driver in another mode.
Figure 5C:
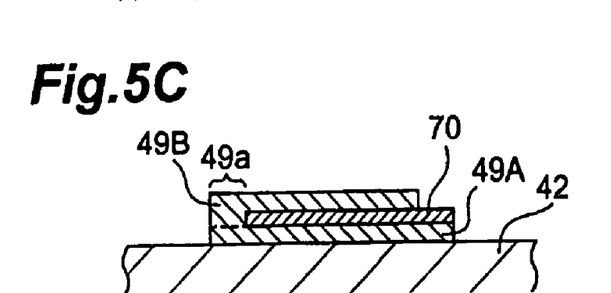

First, as in the above-mentioned procedure of making the arm driver 16 (see FIGS. 4A to 4E), a rectangular piezoelectric film pattern 49A made of PZT is formed on one surface 42b of a silicon substrate 42 doped with impurities (see FIG. 5A). In the upper face region of the piezoelectric film pattern 49A, the area excluding one end area 49a in the end parts longitudinally opposing each other in the piezoelectric film pattern 49A is formed with an electrode film 70 by vapor deposition, sputtering, or the like (see FIG. 5B). Subsequently, a piezoelectric film pattern 49B having the same crystal orientation as that of the piezoelectric film pattern 49A is formed on upper face regions of the piezoelectric film pattern 49A and electrode film 70 so as to expose the part of the electrode film 70 formed at the other end area in the end parts longitudinally opposing each other in the piezoelectric film pattern 49A (see FIG. 5C). Namely, in one end area 49a in the end parts longitudinally opposing each other in the piezoelectric film pattern 49A, the piezoelectric film pattern 49B is laminated on the piezoelectric film pattern 49A so as to keep the crystallinity.

Figures 5D, 5E:
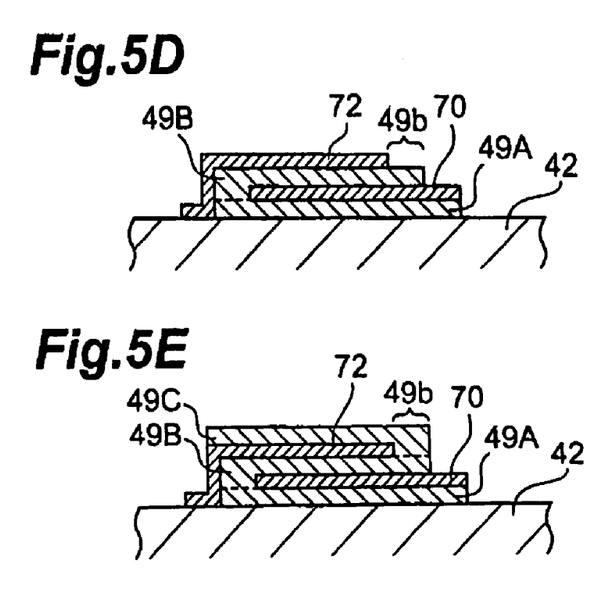
Figure 5F:
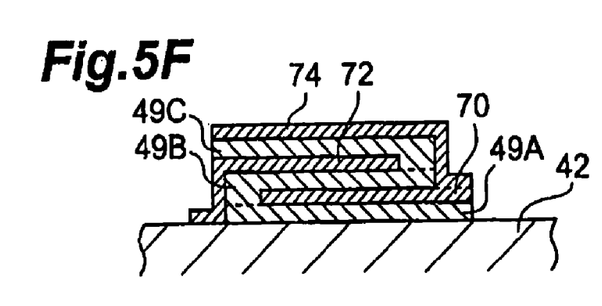

Further, an electrode film 72 is formed on the piezoelectric film pattern 49B so as to expose the partial region 49b of the piezoelectric film pattern 49B without covering the exposed part of the electrode film 70 (see FIG. 5D). The electrode film 72 is also formed on the side face of the piezoelectric film patterns 49A, 49B opposite from the side where the electrode film 70 is exposed, and is electrically connected to the silicon substrate 42. Then, a piezoelectric film pattern 49C having the same crystal orientation as that of the piezoelectric film patterns 49A and 49B is formed so as to cover the upper face of the electrode film 72 and the exposed part of the piezoelectric film pattern 49B (see FIG. 5E). Namely, the piezoelectric film pattern 49C is laminated on the piezoelectric film pattern 49B so as to keep the crystallinity. Finally, an electrode film 74 is laminated so as to cover the piezoelectric film pattern 49C and the exposed part of the electrode film 70 (see FIG. 5F). In thus formed laminate structure to become an arm driver, the topmost electrode film 74 is a thin-film electrode which is substantially the same as the thin-film electrode 22 in the first embodiment, whereas the three layers of the piezoelectric film patterns 49A, 49B, 49C and the two layers of electrode films 70, 72 alternately interposed therebetween become a piezoelectric part substantially the same as the piezoelectric part 20 in the first embodiment.

Using the silicon substrate 42 having such a laminate structure, an actuator comprising arm drivers having a laminate structure is formed. Since the piezoelectric part has a laminate structure, thus formed actuator can attain a greater amount of displacement for each silicon arm 14 than does the actuator 10 in accordance with the first embodiment.

Third Embodiment

Figure 6:
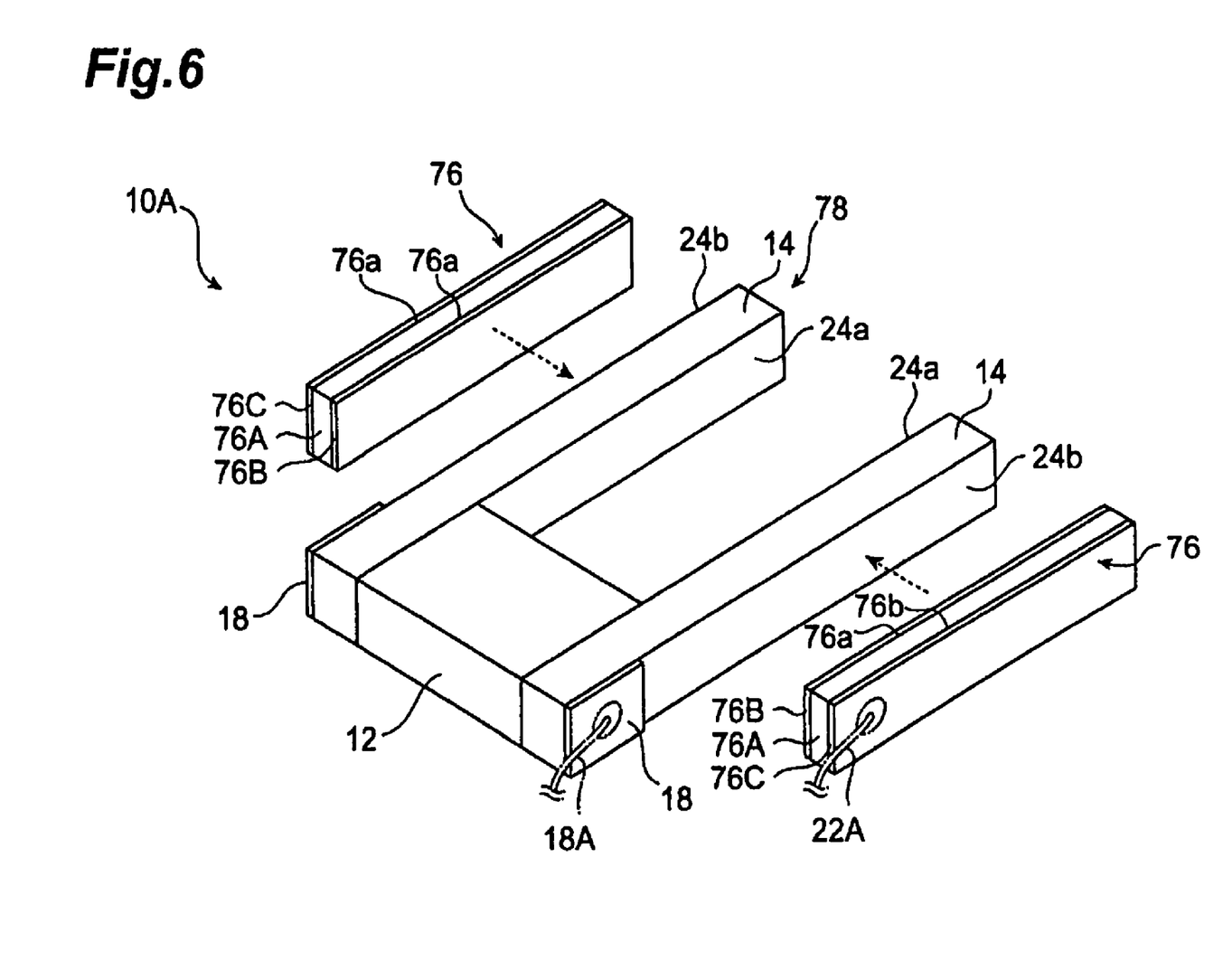
FIG. 6 is a schematic perspective view showing an actuator in a mode using piezoelectric devices.

Though the above-mentioned first and second embodiments show the actuators having arm drivers 16 made by using laminating techniques, an actuator may be made by utilizing a separately prepared arm driver. Namely, as shown in FIG. 6, a piezoelectric device 76 formed like a rectangular column in which a piezoelectric plate (piezoelectric part) 76A constituted by a piezoelectric material is held between a pair of electrode plates 76B, 76C on both sides may be used as an arm driver. FIG. 6 is a schematic perspective view showing an actuator in a mode using piezoelectric devices.

A procedure of making this actuator 10A will now be explained. First, in a procedure substantially the same as that of making the actuator 10 shown in the above-mentioned first embodiment, a structure 78 constituted by silicon arms 14, a glass substrate 12, and thin-film electrodes 18 alone is made. Subsequently, the piezoelectric device 76 is bonded and secured to each silicon arm 14 such that one electrode plate 76B of each piezoelectric device 76 and a surface 24b opposite from the bonding surface 24a between the silicon arm 11 and the glass substrate 12 oppose each other, and such that the longitudinal direction of the silicon arm 14 and the longitudinal direction of the piezoelectric device 76 align with each other. Not only electrically conductive adhesives such as those of epoxy, silicone, and acrylic types, but insulating adhesives may also be used as long as they are partly applied so as to secure an electric connection between the silicon arm 14 and the electrode plate 76B.

In the actuator 10A explained in the foregoing, each silicon arm 19 having lowered its resistance by doping with impurities is utilized as a conductive path for applying a voltage to the respective piezoelectric plate 76A. A surface 76b opposite from the surface 76a facing the silicon arm 14 in the piezoelectric plate 76A is formed with an electrode plate (first electrode corresponding to the above-mentioned thin-film electrode 22) 76C to which one bonding wire 22A in a pair of bonding wires 18A, 22A for applying a voltage to the piezoelectric plate 76A is attached. Therefore, a voltage can be applied to the piezoelectric plate 76A regardless of where the other bonding wire 18A in the pair of bonding wires 18A, 22A is attached to the silicon arm 14. Namely, the bonding wire 18A can be attached to the silicon arm 14 while appropriately selecting positions and surfaces where the bonding wire 18A is easily attachable. As a consequence, a pair of bonding wires 18A, 22A can be attached to this actuator more easily than to the conventional actuator.

Fourth Embodiment

Figure 7:
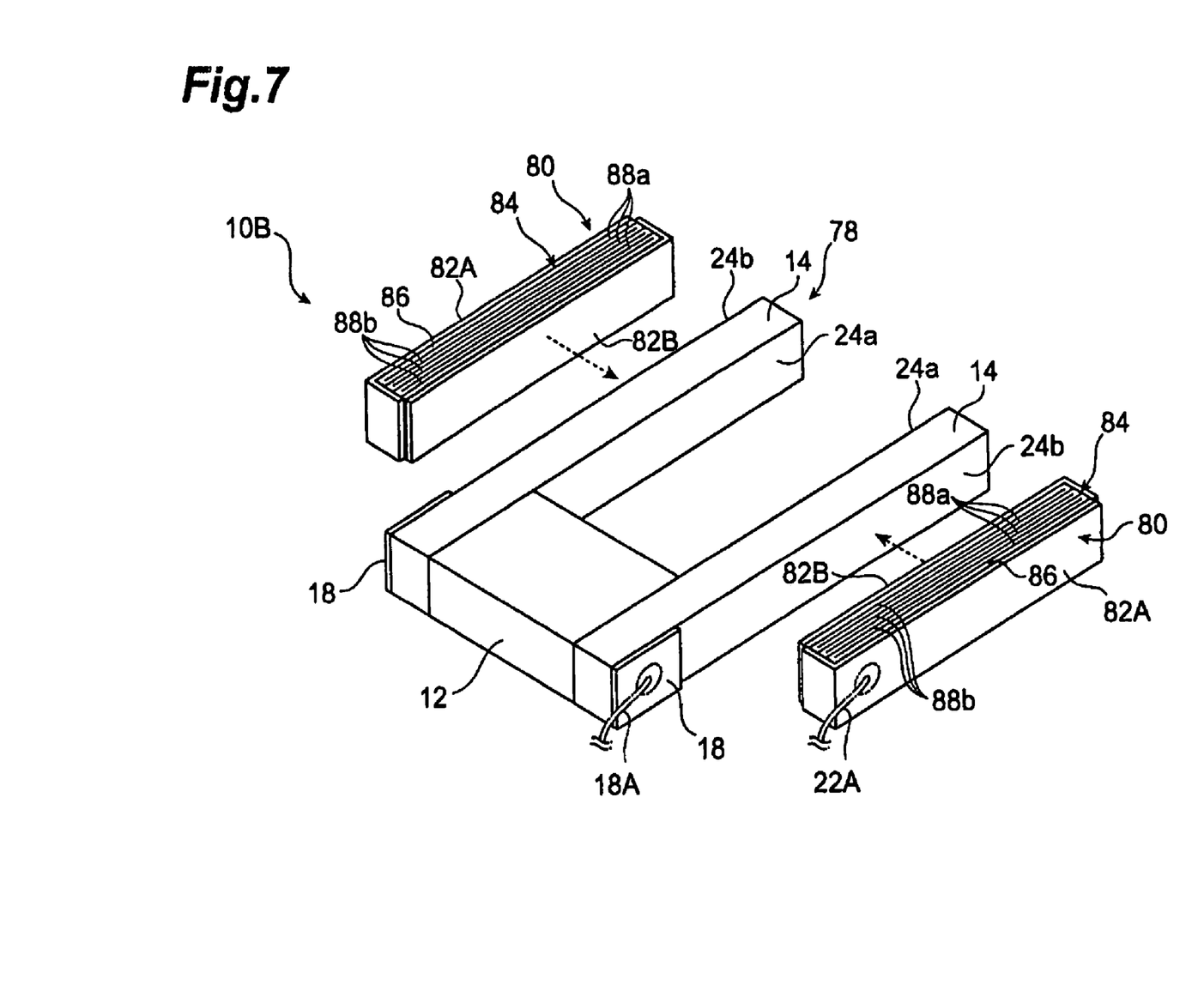
FIG. 7 is a schematic perspective view showing an actuator using piezoelectric devices in a mode different from that of FIG. 6.

The piezoelectric device attached to the silicon arm 14 is not limited to the piezoelectric device 76 having a single layer of piezoelectric plate shown in the third embodiment, but may be a laminated piezoelectric device 80 in which a plurality of piezoelectric layers and inner electrodes are laminated as shown in FIG. 7. FIG. 7 is a schematic perspective view showing an actuator using piezoelectric devices in a mode different from that in FIG. 6. Namely, the actuator 10B in accordance with the fourth embodiment utilizes a piezoelectric device 80, in which a pair of outer electrode plates 82A, 82B each having an L-shaped cross section hold a laminated piezoelectric body (piezoelectric part) 84 therebetween, as an arm driver. The laminated piezoelectric body 84 is constituted by piezoelectric layers 86 and inner electrodes 88a, 88b which are alternately laminated. An end part of each inner electrode 88a is exposed at one end face of the laminated piezoelectric body 84 and is connected to the outer electrode 82B. On the other hand, an end part of each inner electrode 86b is exposed at the other end face of the laminated piezoelectric body 84 and is connected to the outer electrode plate 82A.

Each piezoelectric device 80 is bonded and secured to the respective silicon arm 14 so as to have a longitudinal direction aligning with that of the piezoelectric device 76 such that one outer electrode plate 82B opposes the surface 24b opposite from the surface 24a bonded to the glass substrate 12 in the silicon arm 14. Here, the other outer electrode plate 82A (first electrode) is not in contact with the silicon arm 14 but forms a gap therebetween.

In the actuator 10B explained in the foregoing, as in the actuator 10A in accordance with the third embodiment, the bonding wire 18A can be attached to each silicon arm 14 while appropriately selecting positions and surfaces where the bonding wire 18A is easily attachable. As a consequence, a pair of bonding wires 18A, 22A can be attached to this actuator more easily than to the conventional actuator. In addition, since the piezoelectric device 80 is of laminate type, the amount of displacement of each silicon arm 14 can be made greater than that in the actuator 10A having the piezoelectric device 76. As the piezoelectric device, not only the single-plate and laminate types, but those of bimorph type can also be utilized.

The basic Japanese Application No. 2002-345815 filed on Nov. 28, 2002 and Japanese Application No. 2002-346476 filed on Nov. 28, 2002 are hereby incorporated by reference.

The invention claimed is:

1. An actuator comprising:
    an insulating substrate;
    a pair of silicon arms, doped with an impurity, having respective end parts connected to opposite end faces of the insulating substrate;
    each silicon arm provided at a surface, opposite from the surface connected to the insulating substrate, with a piezoelectric part; and
    each piezoelectric part provided with a first electrode at a surface opposite a surface facing the respective silicon arm.

2. An actuator according to claim 1, further comprising each silicon arm provided with a second electrode at the same surface that the respective piezoelectric part is provided at.

3. An actuator according to claim 1, wherein the insulating substrate is constituted by glass.

4. An actuator according to claim 1, wherein the piezoelectric part is a single-layer piezoelectric film.

5. An actuator according to claim 4, wherein the piezoelectric film is constituted by PZT.

6. An actuator according to claim 1, wherein the piezoelectric part has a laminate structure comprising alternately laminated piezoelectric and electrode films.

7. An actuator according to claim 1, wherein the first electrode comprises a multilayer structure including a topmost layer constituted by Au or Pt.

8. A method of making an actuator, the method comprising the steps of:
    forming a piezoelectric film pattern on one surface each of two silicon substrates doped with an impurity;
    forming an electrode film on the piezoelectric film pattern;
    bonding the two silicon substrates, each formed with the piezoelectric film pattern and electrode film, to opposite sides of an insulating substrate, respectively, such that the piezoelectric film patterns are oriented outward;
    cutting a block having a predetermined form from a laminated substrate constituted by the two silicon substrates and insulating substrate laminated together; and
    forming a silicon arm by cutting the block after partly removing the insulating substrate in the block on one side.

9. A method of making an actuator according to claim 8, further comprising the step of forming an electrode pattern on the silicon substrate.

10. A method of making an actuator according to claim 8, wherein the insulating substrate is constituted by glass.

11. A method of making an actuator according to claims 8, wherein the piezoelectric film pattern is constituted by PZT.

* * * * *